(12) United States Patent
Chen

(10) Patent No.: US 8,294,215 B2
(45) Date of Patent: Oct. 23, 2012

(54) LOW VOLTAGE POWER SUPPLY

(75) Inventor: Xingbi Chen, Chengdu (CN)

(73) Assignee: University of Eletronic Science and Technology (CN)

( * ) Notice: Subject to any disclaimer, the term of this patent is extended or adjusted under 35 U.S.C. 154(b) by 156 days.

(21) Appl. No.: 12/956,685

(22) Filed: Nov. 30, 2010

(65) Prior Publication Data

US 2011/0163351 A1  Jul. 7, 2011

(30) Foreign Application Priority Data

Jan. 4, 2010  (CN) .......................... 2010 1 0000034

(51) Int. Cl.
*H01L 27/085*  (2006.01)
*H01L 21/336*  (2006.01)
(52) U.S. Cl. ....................................... 257/355; 438/279
(58) Field of Classification Search .................. 257/287, 257/350, 355–360, E29.067, E29.237; 438/195, 438/279
See application file for complete search history.

(56) References Cited

U.S. PATENT DOCUMENTS

| | | | | |
|---|---|---|---|---|
| 5,637,900 A | * | 6/1997 | Ker et al. ...................... | 257/355 |
| 5,889,309 A | * | 3/1999 | Yu et al. ........................ | 257/363 |
| 6,064,093 A | * | 5/2000 | Ohta ............................. | 257/355 |

* cited by examiner

*Primary Examiner* — Calvin Lee
(74) *Attorney, Agent, or Firm* — Kilpatrick Townsend & Stockton LLP

(57) ABSTRACT

This invention provides a structure for low-voltage power supply in high-voltage devices or IC's made on a semiconductor substrate of a first conductivity type. The structure comprises a heavily doped semiconductor region of the first conductivity type between, but not contacted with, two semiconductor regions of the second conductivity type. When the two semiconductor regions of the second conductivity type have reverse-biased voltage with respect to substrate, the depletion region of substrate reaches the heavily doped semiconductor region of the first conductivity type, the heavily doped semiconductor region of the first conductivity type constructs a terminal of low-voltage power supply and any one of the semiconductor region of the second conductivity type constructs another terminal. The heavily doped semiconductor region is used as one terminal of a primary low-voltage power supply and any other region is used as another terminal of it. Thus, the cost of a low-voltage power supply can be reduced and the electrical performances be improved.

2 Claims, 7 Drawing Sheets

LOW VOLTAGE POWER SUPPLY

FIELD OF THE INVENTION

The present invention relates to the field of semiconductor Power Integrated Circuits (PICs), and specifically to a low-voltage power supply.

BACKGROUND OF THE INVENTION

Generally speaking, a power IC includes high-voltage power devices and low-voltage integrated circuit, wherein the high-voltage power devices are controlled and examined by the low-voltage integrated circuit. In the low-voltage integrated circuit, a low-voltage power supply is needed and the voltage of the power supply should be much lower than the voltage of the power supply for the power devices. Although a low-voltage power supply can be realized by switching a high-voltage device, and converting high-voltage power supply to low-voltage power supply through a converter, at least one low-voltage power supply is necessary for the initial switching operation.

FIG. 1 shows schematically a conventional structure of power supply for the low-voltage integrated circuit realized by a capacitor. As shown in FIG. 1, the low-voltage integrated circuit controls the turning-on and -off of high-voltage power device (see n-type Metal-Oxide-Semiconductor Field-Effect Transistor (n-MOST) in FIG. 1), and the capacitor C serves as the power supply to the low-voltage integrated circuit. To be specific, the drain electrode D of power n-MOST has a positive voltage $V_{DS}$ with respect to the source electrode S, and the gate-source voltage $V_{GS}$ produced by the low-voltage integrated circuit is used to control the current of the power n-MOST. The positive voltage $V_{S'S}$ with respect to the source electrode S, which is formed by the charges accumulated on the capacitor C, provides power supply for the low-voltage integrated circuit. In conventional techniques, the capacitor is charged by high-voltage power supply, and $V_{S'S}$ is much lower than $V_{DS}$ (refer to Ref [1]). In practice, the capacitor C can be charged by connecting it in series to the high-voltage terminal through a resistance. However, the integrated of resistance in power IC is at an expense of the cost.

Besides, the series resistance can be an active one, which must be normally-on (e.g. a depletion mode high-voltage MOST), and only can be turned off when the capacitor is charged up to a certain voltage (refer to Ref [2]). However, power devices are mostly normally-off high-voltage devices and to implement both of high-voltage normally-on and normally-off devices in one chip will increase the fabrication cost. In order to avoid the extra cost caused by the implement of normally-on device, an isolated region of an opposite conductivity type with the substrate can be implemented in the surface of substrate.

FIG. 2 shows schematically the structure of conventional technology of power supply of a low-voltage circuit by using a region of an opposite conductivity type with substrate underneath the surface to charge capacitor C. As shown in FIG. 2, the left portion of the left dashed line and the right portion of the right dashed line are n-VDMOSTs, and a floating p-region is underneath the surface of n-substrate between the two dashed lines; when $V_{DS}$ increases from 0V to a certain level, the n⁻-substrate surrounded the floating p-region can be fully depleted, inducing a positive voltage with respect to source electrode S in the floating p-region, and charging the capacitor C to the required value $V_{s's}$. The floating p-region is directly used as an output terminal of the low-voltage power supply, or as a control voltage of a transistor to indirectly control the current provided to low-voltage power supply. In FIG. 2, there is a diode D in the charging path for floating p-region and capacitor C to prevent the current flowing back with potential decreasing of floating p-region (refer to Ref [3])

In practice, in order to continually maintain $V_{S'S}$ at a constant value but not too high during the switching operation state of the power device, a controlled MOST is usually connected in series between the electrode connecting with floating p-region and source electrode S. When the value of $V_{S'S}$ is over high, making the potential of floating p-region lower than the anode of capacitor C, the floating p-region does not charge capacitor C any more. Turn on the MOST by controlling its gate voltage, the charges in the floating p-region will flow to source S through the MOST, causing the potential of floating p-region to decrease. The recharging of capacitor C can be realized by turning off the MOST. The disadvantage of this method is that the only path for supplying charges to floating p-region to increase its potential is the leakage current from the reverse-biased p-n junction constructed by the floating p-region and n⁻-substrate. Due to the leakage current is very small, a long time is needed to make the potential of floating p-region reach the required value, which is a disadvantage in most cases.

REFERENCES

[1] Fengtai Huang, "Start-up Circuit for Power Converters with Controller", U.S. Pat. No. 6,778,411 B2.
[2] Johan Christian Halberstadt, "On Chip Current Source", U.S. Pat. No. 6,504,352 B2.
[3] X. B. Chen, Chinese patent ZL200810097388.6, or U.S. Pat. No. 7,701,006 B2, Apr. 20, 2010.
[4] X. B. Chen, U.S. Pat. No. 5,726,469 A, or Chinese patent ZL 95108317.1.

SUMMARY OF THE INVENTION

As examples have been shown in the figures and their descriptions, a low-voltage power supply implemented by using a clamped region of high-voltage device is proposed. The present invention can be summarized by referred to FIG. 3 and FIG. 5 as follows.

1. Refer to FIG. 3, a low-voltage power supply, wherein the low-voltage power supply comprising: a semiconductor substrate of a first conductivity type (see n⁻-region 002), at least two semiconductor regions of a second conductivity type (see p-region 003 and p-region 004) underneath a first main surface (the upper surface) and a heavily doped semiconductor region (see n-region 010) of the first conductivity type between the two semiconductor regions of the second conductivity type being not directly contacted with the two semiconductor regions of the second conductivity type;

when the two semiconductor regions of the second conductivity type (see p-region 003 and p-region 004) have reverse-biased voltage with respect to the substrate, and the depletion region of the substrate reaches the heavily doped semiconductor region (see n-region 010) of the first conductivity type, the heavily doped semiconductor region of the first conductivity type has a neutral region, called as clamped region, to form a terminal of the low-voltage power supply;

the potential of the clamped region is different from any neutral region in the two semiconductor regions of the second conductivity type (see p-region 003 and p-region 004), and also different from the neutral region of substrate (the neutral region in n⁻-region 002 and n⁺-region 001, e.g. n⁺-region 001); such any neutral region can form another terminal of the low-voltage power supply according to requirements;

the semiconductor substrate of the first conductivity type is contacted or not contacted to a heavily doped semiconductor layer of the first conductivity type (see n⁺-region 001) on a second main surface (the lower surface of n-region 002).

2. Refer to FIG. 5, a low-voltage power supply according to point 1, wherein two terminals (h and S) of the low-voltage power supply are the two terminals of a primary power supply; the two terminals of the primary power supply are connected to two input terminals (103 and S on the top of the left most portion) of a low-voltage circuit, and two output terminals (S' and S) of the low-voltage circuit are used as secondary low-voltage power supply.

DESCRIPTION OF THE PREFERRED EMBODIMENTS

In this section, the present invention will be described and illustrated in detail with reference to the drawings, wherein the illustrative embodiments of the present invention will be demonstrated.

The solid bold lines represent electrode contacts. In order to form a good electrical contact, a heavily doped un-depleted region may be formed below the electrode. Such heavily doped un-depleted regions are not shown explicitly in the figures of this invention unless for special cases.

Figure 3:
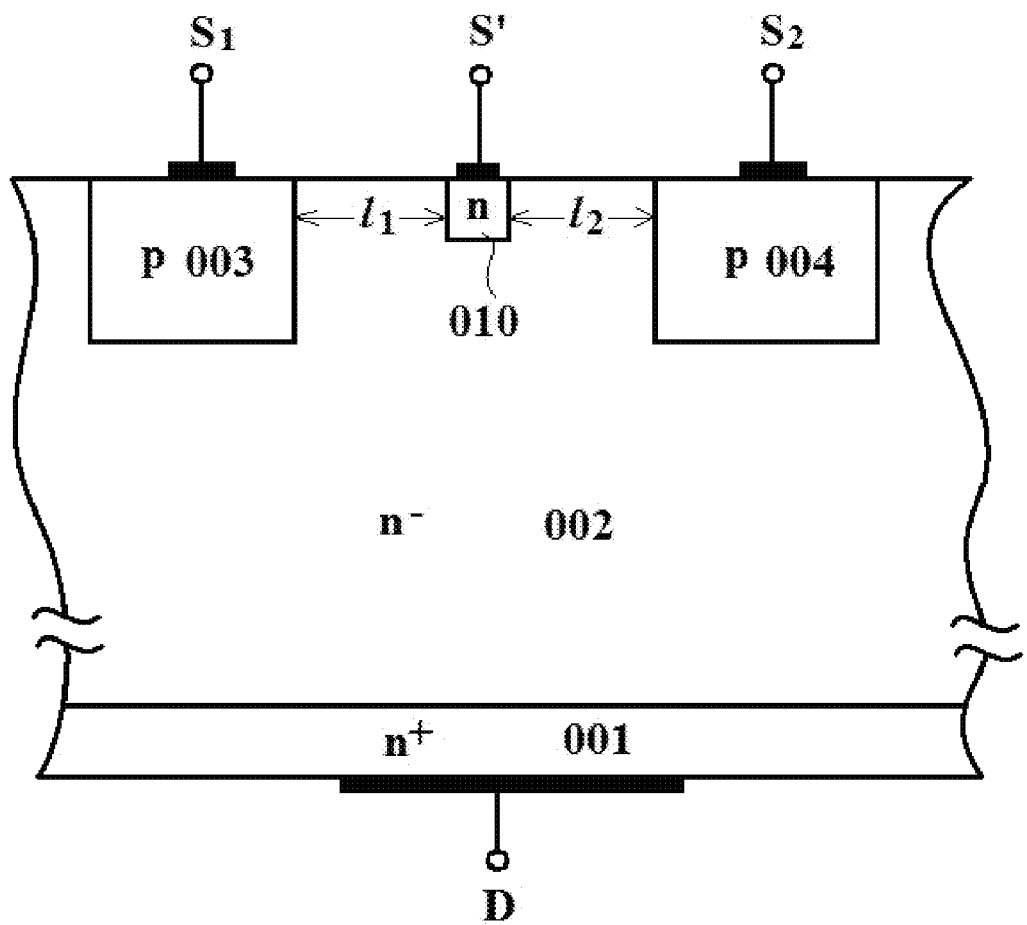
FIG. 3 shows schematically the structure of a low-voltage power supply proposed by the present invention.

FIG. 3 shows schematically a low-voltage power supply proposed in the present invention. As shown in FIG. 3, a heavily doped n⁺-region 001 with an electrode D covering on it is implemented underneath the n⁻-substrate 002. An n-type clamped region 010 covered by an electrode S' is implemented underneath the upper surface of n⁻-substrate 002. Two p-regions, 003 and 004, are implemented at the two sides of n-clamped region 010, connected to electrode $S_1$ and electrode $S_2$, respectively. In this figure, the distance "$l_1$" stands for the distance from the left end of n-clamped region 010 to the right end of p-region 003, and the distance "$l_2$" stands for the distance from the right end of n-clamped region 010 to the left end of p-region 004. With the voltage drop across electrodes D and $S_1$, $V_{DS1}$, increasing from 0V, a positive voltage with respect to electrode $S_1$ is induced in the n-clamped region 010. When $V_{DS1}$ increases, the depletion region in n⁻-substrate 002 extends, but there is always an un-depleted region in the region 010. When $V_{DS1}$ increases to a certain level to make the n⁻-substrate between two p-regions 003 and 004 except the n-clamped region fully depleted, the voltage $V_{S'S1}$ will not varies significantly with the increase of $V_{DS1}$, forming a primary low-voltage power supply. In the same way, the voltage drop across n-clamped region and electrode $S_2$, $V_{S'S2}$, can also form a primary low-voltage. That is to say, the un-depleted region in n-clamped region 010 serves as one electrode terminal of the low-voltage power supply, and an un-depleted region in p-region 003 or p-region 004 serves as another electrode terminal of the low-voltage power supply.

Figure 4:
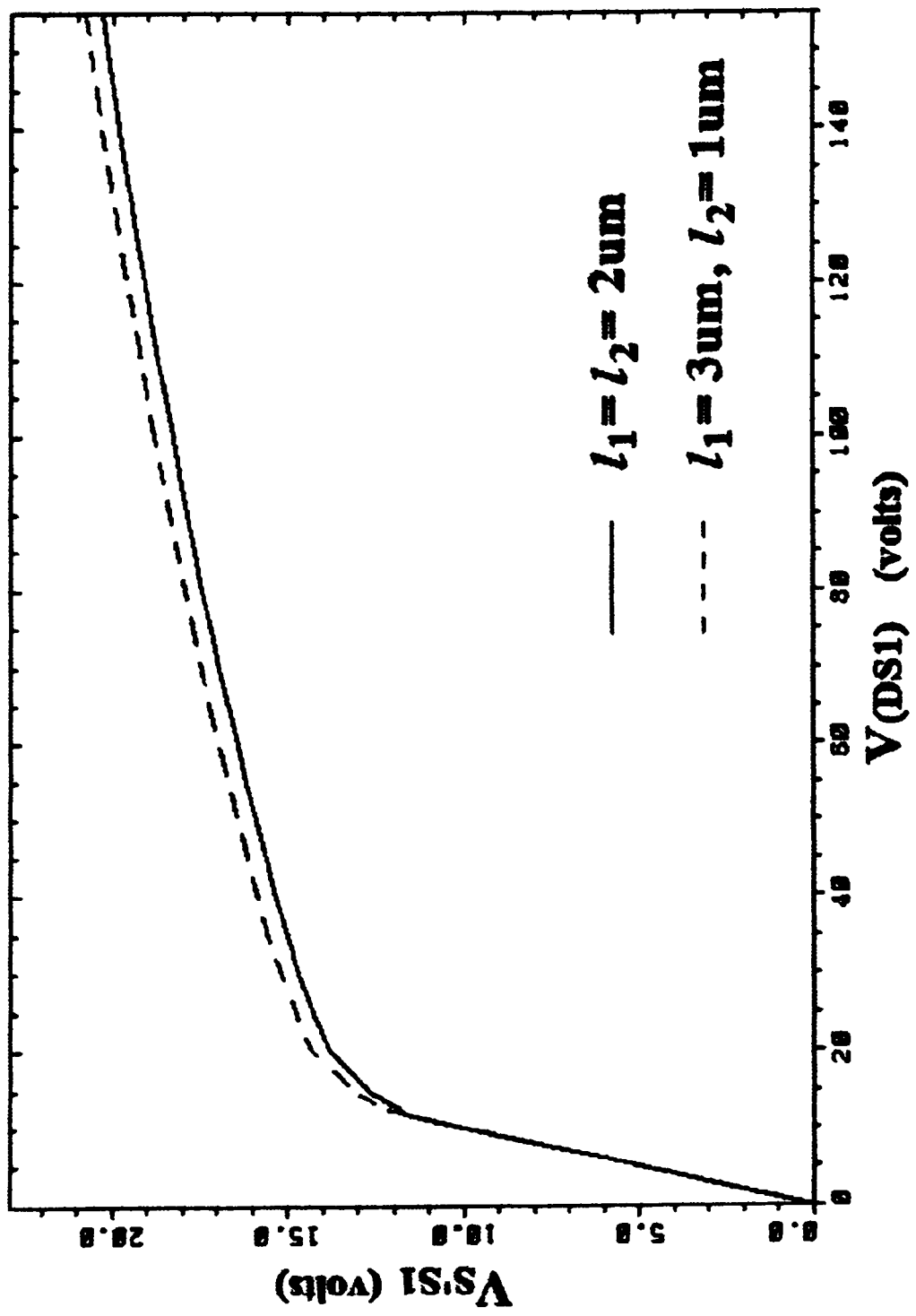
FIG. 4 shows the relationships between $V_{S'S1}$ and $V_{DS1}$ under different locations of the n-clamped region in FIG. 3, simulated by using TMA-MEDICI package.

FIG. 4 shows the relationships between $V_{S'S1}$ and $V_{DS1}$ under different locations of the n-clamped region in FIG. 3, simulated by using TMA-MEDICI package. In the simulations, the potentials of electrodes $S_1$ and $S_2$ are set as the same. n⁺-region 001 is set for obtaining a good ohmic contact between the substrate having high resistivity and the back electrode, and thereby the concentration of n⁺-region 001 has no substantial effect on the electrical properties of the structure proposed in the present invention. Those skilled in the art can choose appropriate ion-implantation and make the doping profile meets the specific requirements. Herein, the concentration of n⁻-substrate 002 is $2\times10^{14}$ cm⁻³, and the thickness is 60 μm; the peak concentration of p-region 003 and p-region 004 is $1\times10^{17}$ cm⁻³, and the junction depth is 5 μm; the concentration of n-clamped region 010 is $1\times10^{20}$ cm⁻³, the junction depth is 0.3 μm, and the width is 0.5 μm. The solid line of FIG. 4 demonstrates the relationship between $V_{S'S1}$ and $V_{DS}$ when $l_1=l_2=2$ μm, and the dashed line demonstrates the relationship between the two voltages when $l_1=3$ μm, $l_2=1$ μm. It should be noted that, the above values of parameters are not optimized, those skilled in the art can make appropriate modification under different conditions.

As shown in FIG. 4, when $V_{DS1}$ increases from 0V, a positive voltage $V_{S'S1}$ with respect to electrode $S_1$ is induced in the n-clamped region 010. The value of $V_{S'S1}$ increases rapidly with the increasing of $V_{DS1}$ at first. When $V_{DS1}$ increases to such a value that the n⁻-substrate between two p-regions 003 and 004 except the n-clamped region are fully depleted (such value of $V_{DS1}$ is about 12V as shown in FIG. 4), $V_{S'S1}$ does not increase significantly with the increasing of $V_{DS1}$ any more.

Figure 1:
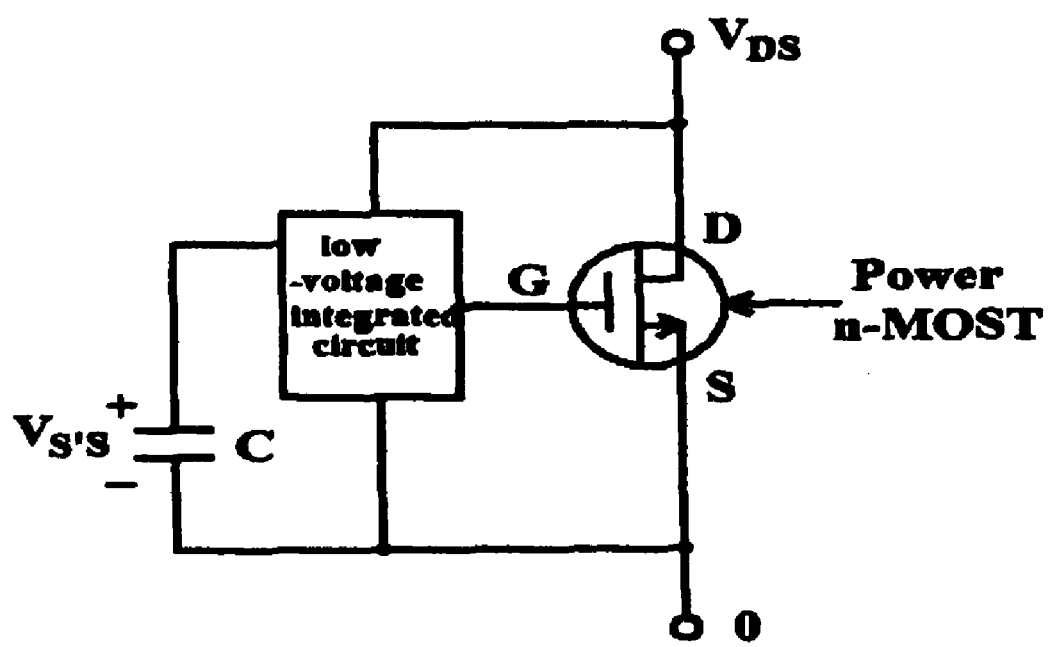
FIG. 1 shows schematically the structure of using a capacitor for supplying power to low-voltage integrated circuit in conventional technology.
Figure 2:
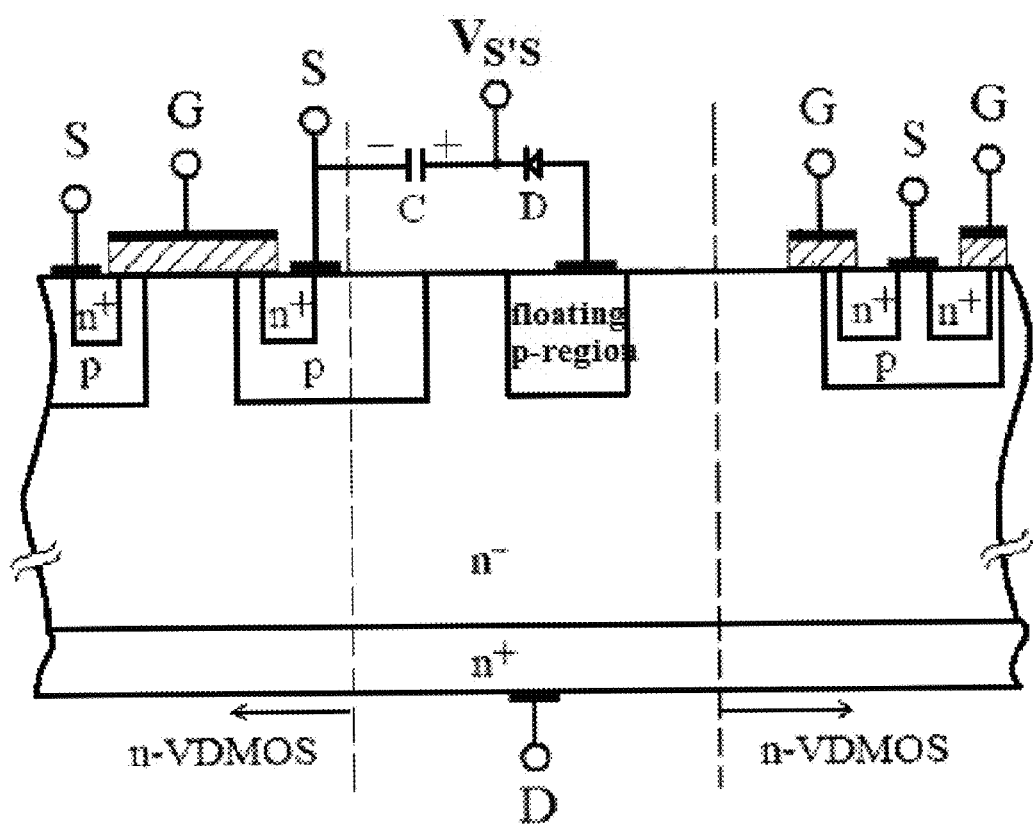
FIG. 2 shows schematically to charge capacitor C by using the region of an opposite conductivity type with substrate underneath the surface of substrate in the conventional low-voltage power supply.

The low-voltage power supply shown in FIG. 3 can be directly applied to charge the capacitor C shown in FIG. 1. Here, the capacitor C is a primary power supply. The low-voltage power supply shown in FIG. 3 can also be applied to a control terminal of a transistor to indirectly control the charge current of the capacitor C. Here, the capacitor C is a secondary power supply, which is the real low-voltage power supply in power ICs.

Figure 5:
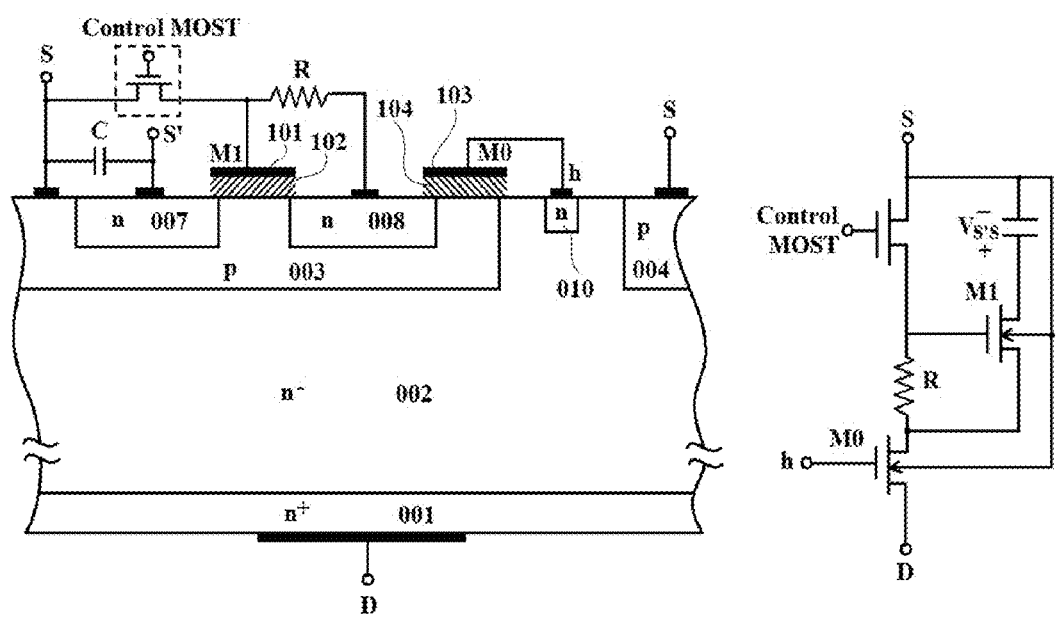
FIG. 5 shows schematically the structure by using the voltage induced by the clamped region as gate voltage of a MOST to indirectly charge the capacitor C (the right portion shows its equivalent circuit)

The left portion of FIG. 5 shows schematically the structure by using the voltage induced by the clamped region as gate voltage of a MOST to charge indirectly the capacitor C, and the right portion shows its equivalent circuit.

Similar to FIG. 3, there is an n-clamped region 010 between p-regions 003 and 004 in FIG. 5, covered with an electrode h on it, forming a primary power supply. To compare with the structure shown in FIG. 3, there are two n-regions 007 and 008 implemented in the source-body p-region 003 in FIG. 5. Herein, n-region 007 is covered with an electrode S'. In this Figure, an insulator layer 104 covers on partial n-region 008, partial n⁻-region 002 and p-region 003 between them and is covered by an electrode 103. Herein, n⁻-region 002 is the drain region of n-type MOST $M_0$, n-region 008 is the source region and electrode 103 is the gate electrode. An insulator layer 102 covers on partial n-region 007, partial n-region 008 and p-region 003 between them and is covered by an electrode 101. Herein, n-region 008 is the drain region of n-type MOST $M_1$, n-region 007 is the source region and electrode 101 is the gate electrode.

Electrode h is connected to the gate electrode of $M_0$ through inner connection, and the two terminals of capacitor C are connected to electrodes S' and S, respectively. A control MOST is connected between gate electrode 101 of $M_1$ and electrode S, and a resistance is connected between gate electrode 101 of $M_1$ and its drain region 008. When $V_{DS}$ increases from 0V, a positive voltage with respect to p-region 003 is generated in n-clamped region 010. When this voltage is higher than the threshold voltage $V_{th0}$ of $M_0$, $M_0$ is in the conduction state, thus current flows from electrode D through $n^+$-region 001, $n^-$-region 002, the channel region underneath the gate of $M_0$, n-region 008, and then to the gate electrode 101 of $M_1$ through the resistance R, charging the gate capacitor of $M_1$; At this moment, if the control MOST is in off-state, the potential of gate electrode 101 is increased gradually. When the voltage drop across the gate electrode 101 and p-region 003 is higher than the threshold voltage $V_{th1}$ of $M_1$, $M_1$ is turned on, thus current flows from electrode D through $n^+$-region 001, $n^-$-region 002, the channel region underneath the gate of $M_0$, n-region 008, the channel region underneath the gate of $M_1$ and n-region 007 to one terminal of capacitor C, charging the capacitor C. The voltage drop of the charged capacitor C is just the supply voltage $V_{S'S}$ of low-voltage integrated circuit. When the value of $V_{S'S}$ is larger than the value needed, the charging path of capacitor C can be turned off; specifically, turn on the control MOST to lower the gate voltage of $M_1$ to below the threshold voltage $V_{th1}$ of $M_1$, thus turn off $M_1$. Therefore, the charging path mentioned above does not charge capacitor C any more, and the voltage drop of capacitor C keeps constant.

In FIG. 5, the values of doping concentration of each region are only for illustrating the idea; those skilled in the art can recognized that different parameters can be chosen corresponding to different process of manufacture/fabrication as well as performance requirements for particular application without departing from the spirit of the present invention.

All the devices shown in FIG. 5 can be implemented by MOS technology. Apparently, the device to control the one producing low-voltage power supply can be also implemented by other technology. Besides, according to the practical application demands, the structure including one or more such device(s) can be implemented.

Figure 6:
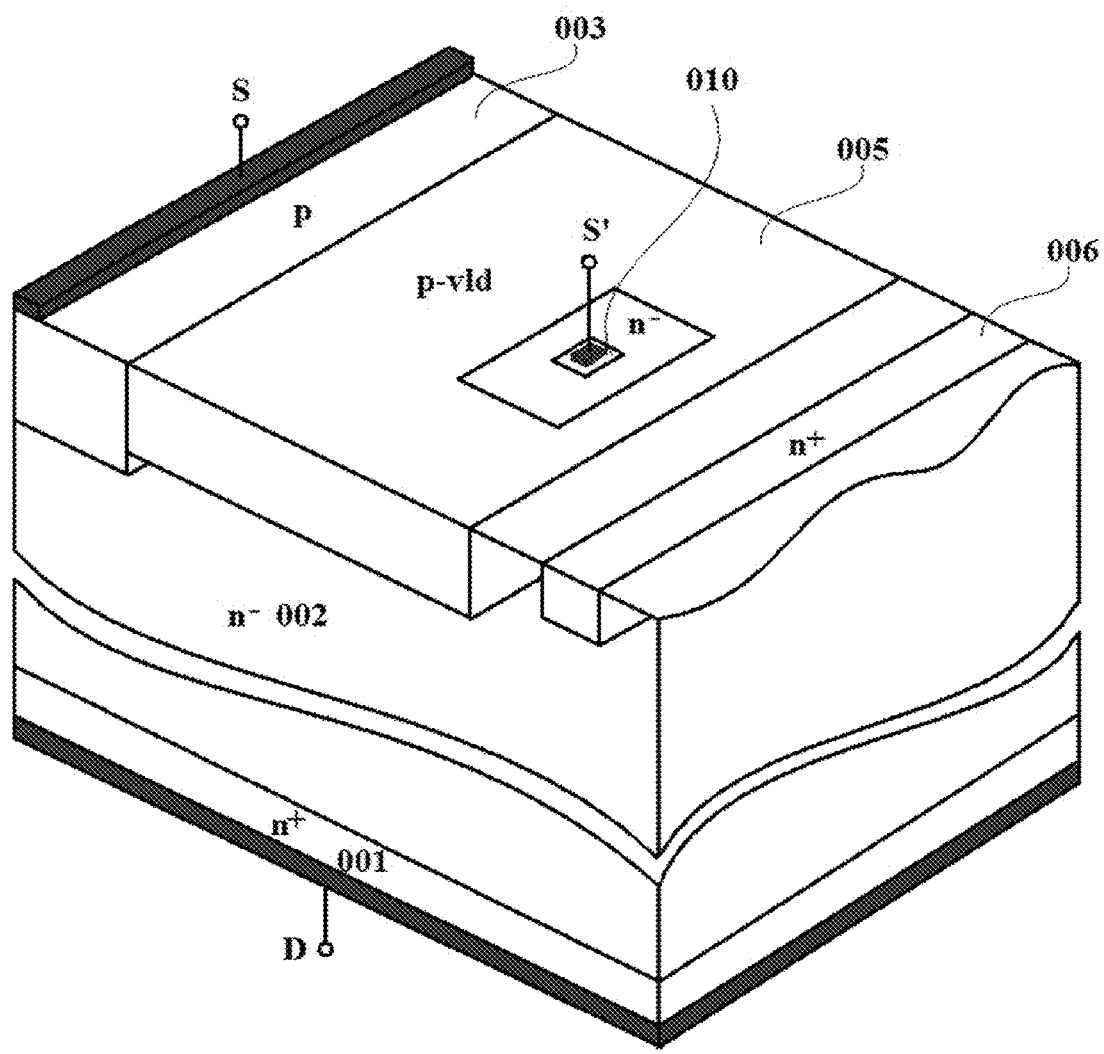
FIG. 6 shows schematically another application of low-voltage power supply proposed by the present invention.

FIG. 6 shows schematically another application of the low-voltage power supply by using the present invention.

As shown in FIG. 6, the "p-vld" region 005 is the surface voltage-sustaining region implemented by utilizing the method mentioned in Ref [4], wherein the $n^+$-region 006 is a stop-ring. In the p-vld region 005 between p-region 003 and $n^+$-region 006, there is an n-clamped region 010 covered with an electrode S'. An electrode D is set on 001. Due to the $n^-$-substrate region 002 except region 010 can be fully depleted under a voltage $V_{DS}$ having a value varying in a large range, a negative voltage $V_{S'D}$ with respect to electrode D can be induced in n-clamped region 010, thus forming a primary negative voltage power supply with respect to electrode D.

Figure 7:
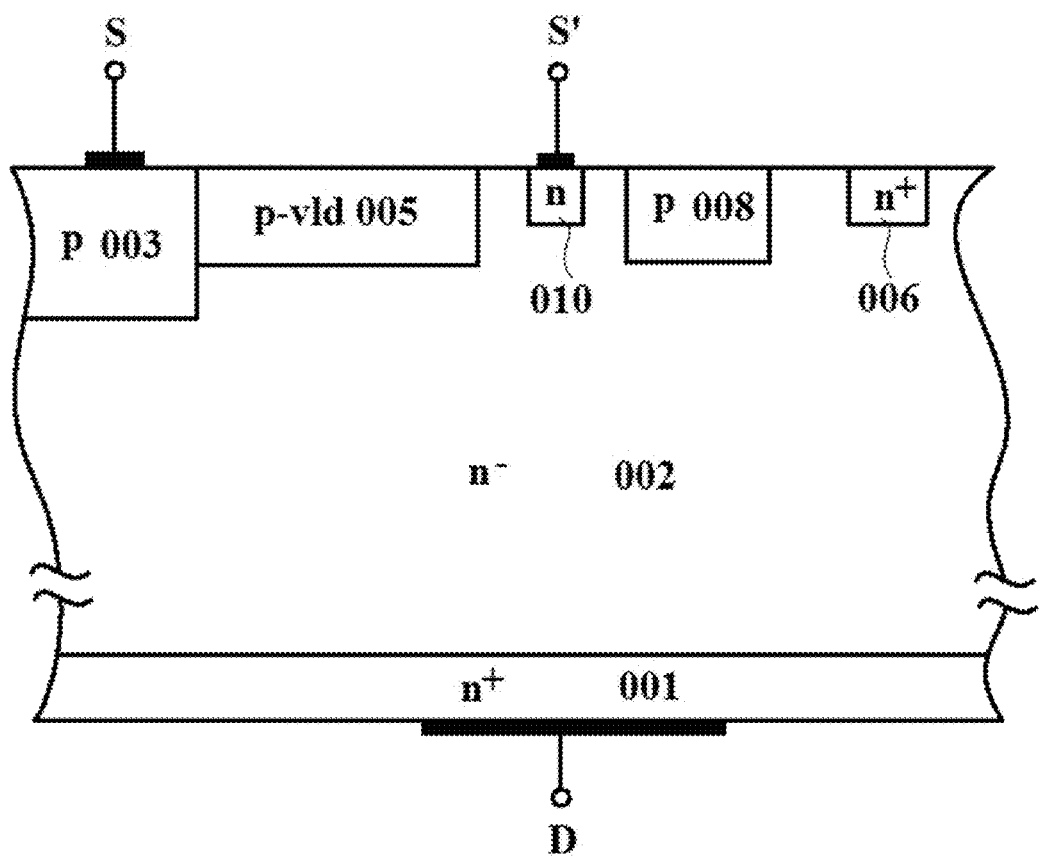
FIG. 7 shows schematically still another application of low-voltage power supply proposed by the present invention.

FIG. 7 shows schematically another application of the low-voltage power supply by using the present invention.

In FIG. 7, p-region 003 is covered with an source electrode S, $n^+$-region 006 is a stop-ring, and the region between p-region 003 and $n^+$-region 006 is a surface voltage-sustaining region (including p-vld region 005, p-region 008 and n-region 010 between them), which is implemented by utilizing the method mentioned in Ref [4]. The n-region 010 is a clamped region, and covered with an electrode S'. Due to the $n^-$-substrate region 002 except region 010 can be fully depleted under a value of voltage $V_{DS}$ varying in a large range, a negative voltage $V_{S'D}$ with respect to electrode D can be induced in n-clamped region 010, thus forming a primary negative voltage power supply with respect to electrode D.

According to the instruction of the present invention, those skilled in the art can clearly recognize that, the low-voltage power supplies of negative voltage with respect to the highest voltage terminal shown in FIG. 6 and FIG. 7 can be used as the primary power supply to indirectly control the charge of the capacitor, similar to the structure shown in FIG. 5, and this is not to be repeated hereinafter. The low-voltage power supply proposed by the present invention has two applications at least: one is producing a low voltage which is positive with respect to electrode S; the other is a low voltage which is negative with respect to electrode D. Although the potentials of the two applied low-voltage power supplies are between the potentials of electrodes S and D, the voltage drop across electrodes D and S of high-voltage power device can be very high; therefore, appropriate structure of device can be chosen according to practical demands in specific application.

According to the introduction of the present invention, those skilled in the art can clearly recognize that, n-clamped region 010 can be used as a terminal of the low-voltage power supply, and any other region whose potential is different to the n-clamped region 010 can be used as the other terminal.

It should be noted that: in FIG. 3, FIG. 5, FIG. 6 and FIG. 7, n-clamped region 010 is not necessarily completely surrounded by the p region with a negative voltage with respect to electrode D. For example, in FIG. 5, if the length in the direction of perpendicular to the paper of n-clamped region 010 is limited, and the lengths of p-region 003 and 004 exceed the range of n-clamped region 010, a potential in n-clamped region 010 different from that of p-region 003 and 004 can also be induced.

Those skilled in the art can recognize that, all of the n-regions and p-regions in the above demonstration can be exchanged each other, the device then changes to a device of a conductivity of opposite type.

The process of this clamped region can be compatible with conventional integrated circuit (IC) technology. For example, the p-regions 003 and 004 shown in FIG. 3 can be implemented by utilizing the method of implementing p-well in conventional IC technology, and the implementation of n-clamped region 010 can use the method of implementing source region of n-MOST in conventional IC technology. Of course, they can also be implemented by utilizing the process of implementing p-type source-body region and $n^+$-type source region, respectively, and so on. As the knowledge possessed by all those skilled of the art, this is not to be repeated hereinafter.

The description of the present invention mainly illustrates various structures of low-voltage power supply. According to the introduction of the present invention, those skilled in the art can design the device structure of low-voltage power supply by utilizing semiconductor standard technology with special utilizations.

Referring to the above illustrative embodiments of this invention, those skilled in the art can clearly know the present invention having the following advantages:

The present invention proposes a low-voltage power supply implemented by using clamped region of high-voltage device. The voltage of the clamped region with respect to p-region or the un-depleted substrate region is directly used as low-voltage power supply, or as primary low-voltage power supply to control the secondary power supply to form a low-voltage power supply. Due to the low-voltage power supply proposed in the present invention need no depletion mode device, the complexity of technology is decreased, and the fabrication cost is reduced. Simultaneously, the application deficiency in conventional technology that needs waiting for a long time to supplement charges for floating p-region to raise the potential is also overcome.

Although the invention has been described and illustrated with reference to specific embodiments thereof, it is not intended that the invention be limited to these illustrative embodiments. Those skilled in the art will recognize that modifications and variations can be made without departing from the spirit of the invention. The object of choosing and describing the examples of the application of the present invention is for better explanation of the theory and practical applications. Apparently, the examples chosen above are for those skilled in the art to understand the present invention and thus be able to design various applications with various modifications for special utilizations.

The invention claimed is:

1. A low-voltage power supply, wherein
   said low-voltage power supply comprising:
   a semiconductor substrate of a first conductivity type;
   at least two semiconductor regions of a second conductivity type underneath a first main surface;
   a heavily doped semiconductor region of said first conductivity type between said two semiconductor regions of said second conductivity type being not directly contacted with said two semiconductor regions of said second conductivity type;
   when said two semiconductor regions of said second conductivity type have reverse-biased voltage with respect to said substrate, and the depletion region of said substrate reaches said heavily doped semiconductor region of said first conductivity type, said heavily doped semiconductor region of said first conductivity type has a neutral region, called as clamped region, to form a terminal of said low-voltage power supply;
   the potential of said clamped region is different from any neutral region in said two semiconductor regions of said second conductivity type, and also different from said neutral region of substrate; said any neutral region can form another terminal of said low-voltage power supply according to requirements;
   said semiconductor substrate of said first conductivity type is contacted or not contacted to a heavily doped semiconductor layer of said first conductivity type on a second main surface.

2. A low-voltage power supply according to claim 1, wherein two terminals of said low-voltage power supply are the two terminals of a primary power supply; said two terminals of said primary power supply are connected to two input terminals of a low-voltage circuit, and two output terminals of said low-voltage circuit are used as secondary low-voltage power supply.

* * * * *

UNITED STATES PATENT AND TRADEMARK OFFICE
CERTIFICATE OF CORRECTION

PATENT NO. : 8,294,215 B2  
APPLICATION NO. : 12/956685  
DATED : October 23, 2012  
INVENTOR(S) : Xingbi Chen Page 1 of 1

It is certified that error appears in the above-identified patent and that said Letters Patent is hereby corrected as shown below:

On the Title Page:

In Item (54) and in the specification, column 1, line 1, Title, please delete "LOW VOLTAGE" and insert --LOW-VOLTAGE--.

In Item (73) of the Assignee, please delete "Eletronic" and insert --Electronic--.

In Item (30) of the Foreign Application Priority Data section, please delete "201010000034" and insert --201010000034.2--.

Signed and Sealed this
Eleventh Day of June, 2013

Teresa Stanek Rea
*Acting Director of the United States Patent and Trademark Office*